United States Patent
Ghiasi

(12) United States Patent (10) Patent No.: US 6,546,345 B1
(45) Date of Patent: Apr. 8, 2003

(54) SYSTEM AND METHOD FOR MEASURING EXTINCTION RATIO AND DETERMINISTIC JITTER

(75) Inventor: Ali Ghiasi, Cupertino, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 342 days.

(21) Appl. No.: 09/650,715

(22) Filed: Aug. 30, 2000

(51) Int. Cl.[7] .................................................. G06F 5/00
(52) U.S. Cl. ............................ 702/67; 702/66; 702/69; 702/70; 702/118
(58) Field of Search .......................... 702/66, 69, 70, 702/67, 118, 121; 375/226, 222; 359/156, 157; 455/115–118

(56) References Cited

U.S. PATENT DOCUMENTS

| | | | | |
|---|---|---|---|---|
| 5,872,810 A | * | 2/1999 | Philips et al. | 375/222 |
| 6,091,940 A | * | 7/2000 | Sorrells et al. | 455/118 |
| 6,167,359 A | * | 12/2000 | Demir et al. | 702/191 |
| 6,408,679 B1 | * | 6/2002 | Kline-Schoder et al. | 73/19.03 |
| 6,434,363 B2 | * | 8/2002 | Rinne et al. | 455/66 |

OTHER PUBLICATIONS

"MDB–9–8–X Fibre Channel MIS —2.125 GBaud," Methode Electronics, Inc., downloaded from http://www.stratoslightwave.com/opto/opto_pdfs/910085a.pdf on Jul. 26, 2000, 8 pages.

"Fibre Channel, Physical and Signaling Interface (FC–PH)," Rev. 4.3, Global Engineering, Jun. 1, 1994, 9 pages.

"Information Technology —Fibre Channel–Methodologies for Jitter Specification," Secretariat National Committee for Infromation Technology Standardization (NCITS), Working Draft, T11.2/Project 1230/Rev 10, Jun. 9, 1999, pp. 1–96.

"A New Method for Jitter Decomposition Through Its Distribution Tail Fitting," Li, et al., Wavecrest Corp., downloaded at http://www.wavecrestcorp.com/technical/itc_99_final–pdf.pdf on Jul. 25, 2000, 7 pp.

* cited by examiner

Primary Examiner—Marc S. Hoff
Assistant Examiner—Felix Suarez
(74) Attorney, Agent, or Firm—Robert C. Kowert; Meyertons, Hood, Kivlin, Kowert & Goetzel, P.C.

(57) ABSTRACT

A system and method of measuring extinction ratio and deterministic jitter of an optical transceiver. The measurement system includes a computing node and an oscilloscope coupled to the computing node. The oscilloscope is also coupled to the optical transceiver. The oscilloscope is configured to capture a waveform of a predetermined data pattern transmitted by the optical transceiver. The oscilloscope is configured to capture the waveform in a nonpersistent mode using waveform averaging. The oscilloscope is also configured to perform measurements on the waveform. The computing node is configured to program the oscilloscope to perform the measurements on the waveform. The computing node is also configured to calculate an extinction ratio and to compare the extinction ratio to an acceptable standard. The computing node is also configured to calculate a deterministic jitter value of the optical transceiver in response to the extinction ratio being within the acceptable standard.

18 Claims, 5 Drawing Sheets

SYSTEM AND METHOD FOR MEASURING EXTINCTION RATIO AND DETERMINISTIC JITTER

BACKGROUND OF THE INVENTION

1. Field of the Invention

This invention relates to device testing and, more particularly, to measuring, for example, the extinction ratio and the deterministic jitter of optical devices.

2. Description of the Related Art

Serial communications links are becoming increasingly popular due to a reduction in the bandwidth and physical limitations that may be imposed by some clock and data bus transmission systems. However, in a high-speed serial communications link, data integrity may be reduced by a problem known as jitter. Jitter may be generally described as a mis-positioning of the significant edges in a sequence of data bits from their ideal positions. If the jitter is significant, data loss may result. Jitter may be generally characterized by two types: deterministic jitter and random jitter. Deterministic jitter is due to non-Gaussian events and is bounded in amplitude. Deterministic jitter has different causes, such as: data dependence, duty cycle distortion, sinusoidal and uncorrelated (to the data). Random jitter is jitter that is Gaussian and it is unbounded. Accordingly, total jitter is the sum of the peak-to-peak values of the deterministic and random jitter.

One example of a serial communication link is an optical fiber link. Optical fiber is fast becoming the main choice for communications due to its signal carrying capabilities. To communicate via an optical fiber link a device commonly referred to as an optical transceiver may be used. An optical transceiver is a device that is used to transmit and receive optical signals through an optical medium such as a fiber optic cable. In most cases, an optical signal must be converted to an electrical signal. To accomplish this, an interface adapter may be necessary. Fiber optic cable and optical links are used in many applications. One such application is a fibre channel application. In a typical fibre channel application, an interface adapter may be used to convert an electrical signal to an optical signal and to transmit that optical signal. The interface adapter may also be used to convert a received optical signal to an electrical signal. Devices that perform these operations may conform to the Media Interface Adapter (MIA) specification and may be referred to as fibre channel MIA devices.

FIG. 1 illustrates a block diagram of one example of a fibre channel MIA device such as, for example, an MDB-9-8-X Fibre Channel MIA manufactured by Methode Electronics, Inc. In FIG. 1, fibre channel MIA device 100 contains both a transmit circuit 110 and a receive circuit 120. This particular example includes an electrical interface 130 and an optical interface 140. Electrical interface 130 may allow for an electrical connector 160 such as, for example, a DB9 connector. Optical interface 140 may allow for direct connection to optical fiber 150, or in some cases, an optical fiber connector (not shown). Transmit circuit 110 may contain a light emitting source such as a laser. It is noted that the fibre channel device of FIG. 1 is only one example of a fibre channel device and that there may be many other devices which may be used.

As described above, the effects of excessive jitter may be a problem in some serial communications links. To ensure that a device, such as fibre channel MIA device 100, does not introduce excessive jitter, it may be tested to determine its jitter. Fiber channel characteristics such as jitter and jitter compliance are outlined in documents such as the Fiber Channel Physical Interface Specification (FC-PI) available from the T11 committee within the National Committee for Information Technology Standards.

To test the data dependent jitter (DDJ) portion of the deterministic jitter of an interface device, some typical test systems may use an eye diagram method and an oscilloscope in a persistent display capture mode. This method may have some inaccuracies due to such factors as scope settings, source laser power output and incorrect extinction ratio settings. Additionally, the eye diagram may contain random jitter components. Therefore it is desirable to have a fast accurate way to measure DDJ using a digitizing oscilloscope.

SUMMARY OF THE INVENTION

Various embodiments of a system and method of measuring extinction ratio and deterministic jitter of an optical transceiver are disclosed. In one embodiment, the measurement system includes a computing node and an oscilloscope coupled to the computing node. The oscilloscope is also coupled to the optical transceiver. The oscilloscope is configured to capture a waveform of a predetermined data pattern transmitted by the optical transceiver. The oscilloscope is configured to capture the waveform in a non-persistent mode using waveform averaging. The oscilloscope is also configured to perform measurements on the waveform. The computing node is configured to communicate with the oscilloscope and to program the oscilloscope to perform the measurements on the waveform. The computing node is also configured to calculate an extinction ratio and to compare the extinction ratio to an acceptable standard. The computing node is also configured to calculate a deterministic jitter value of the optical transceiver in response to the extinction ratio being within the acceptable standard.

In other embodiments, the system may measure the extinction ratio as a ratio of an amplitude of a binary one to an amplitude of a binary zero. The amplitude of said binary one is measured on a non-oscillatory portion of a peak of said binary one and said amplitude of a binary zero is measured on a non-oscillatory portion of a peak of said binary zero. Further, the oscilloscope is configured to measure a position of each of a plurality of data pulse edges corresponding to the pattern of data with respect to a zero reference position. The oscilloscope is also configured to measure the position of each of the plurality of data pulse edges at a 50% crossing point. The 50% crossing point is an average power point of the waveform as measured using a filter.

In an additional embodiment, the system is configured to calculate a deterministic jitter value by first calculating a plurality of positive and negative jitter components corresponding to the plurality of data pulse edges. Next, the system finds a first maximum value of the positive jitter components and a second maximum value of the negative jitter components. Then the system calculates a first absolute value of the first maximum value of the positive jitter components and a second absolute value of the second maximum value of the negative jitter components. The system may then add the first absolute value to the second absolute value.

In addition, a method of operating a measurement system for characterizing an optical transceiver including a computing node and an oscilloscope is contemplated. In one embodiment, a waveform of a predetermined data pattern transmitted by said optical transceiver in a non-persistent mode using waveform averaging is captured. Further, an extinction ratio is calculated and compared to an acceptable standard. A deterministic jitter value of the optical transceiver is then calculated in response to the extinction ratio being within the acceptable standard.

Figure 1:
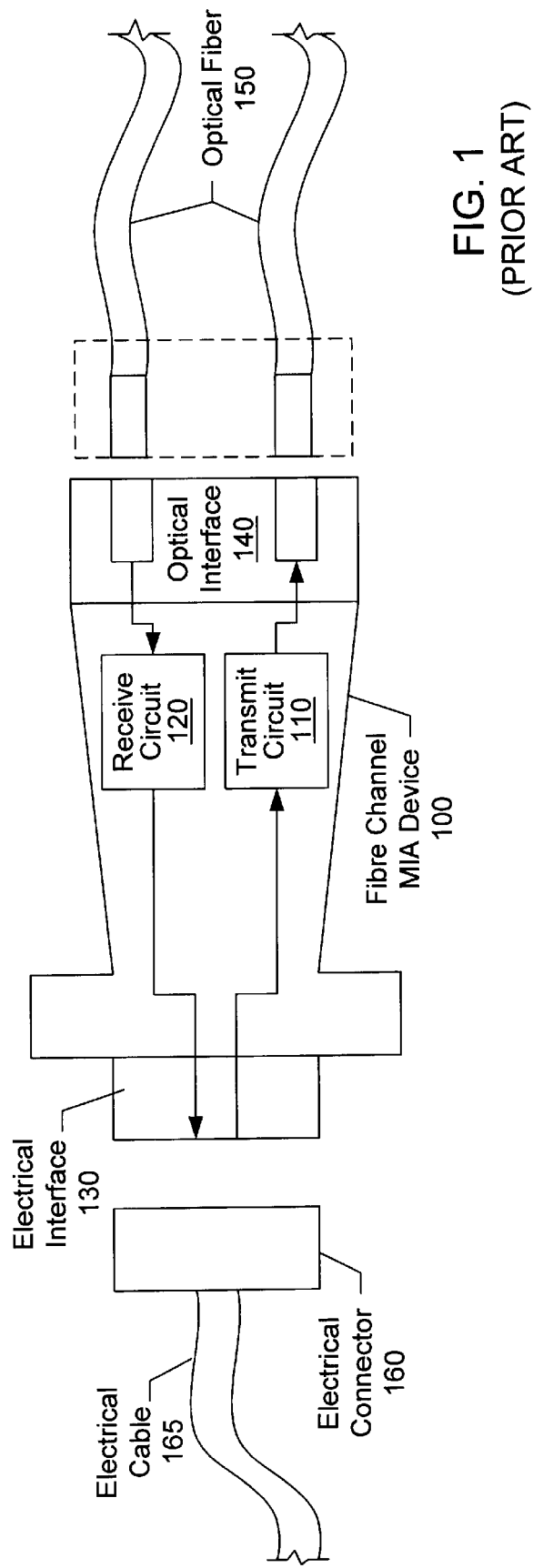
FIG. 1 is a diagram of a conventional fibre channel media interface adapter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
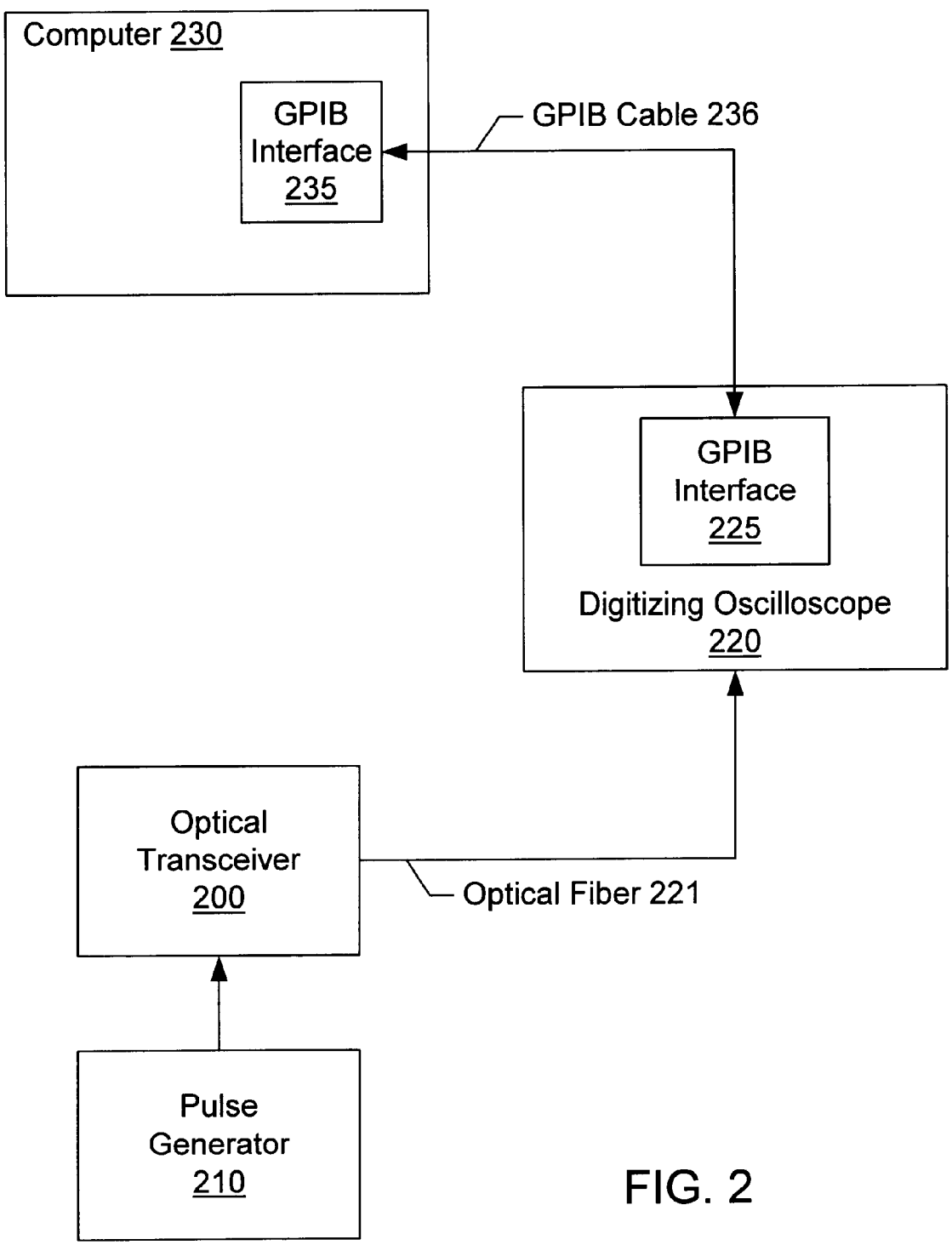
FIG. 2 is a block diagram of one embodiment of an optical transceiver test system.

Turning now to FIG. 2, a block diagram of one embodiment of an optical transceiver measurement system is shown. An optical transceiver 200 is coupled to a digitizing oscilloscope 220 through an optical fiber 221. A pulse generator 210 is coupled to optical transceiver 200 though a standard electrical interface such as, for example, a cable with an electrical connector on each end. A computer 230 is coupled to digitizing oscilloscope 220 through a general-purpose interface bus (GPIB) cable 236.

Pulse generator 210 is configured to provide a digital pattern of pulses to optical transceiver 200. The digital pattern is a predetermined pattern with a series of binary ones and binary zeros. The pattern may contain a number of zero to one and one to zero transitions. In one embodiment, the pattern may be a hexadecimal A05F. This translates to a 16-bit binary pattern of 1010000001011111. It is noted that while a hexadecimal A05F pattern is used in this example, it is contemplated that other patterns may be used such as, for example, a 20-bit pattern. The pattern is transmitted to optical transceiver 200 in a continuous repeating pattern. Optical transceiver 200 converts the electrical signal into an optical signal and transmits the light pulses through optical fiber 221.

In one embodiment, computer 230 may be configured to communicate with digitizing oscilloscope 220 through GPIB cable 236 using a GPIB interface 235. Digitizing oscilloscope 220 may be configured to communicate through a GPIB interface 225 using a GPIB protocol. The GPIB command set and specification is contained in the IEEE-488 specification, which is available from the Institute of Electrical and Electronics Engineers. Computer 230 sends commands to and receives information from digitizing oscilloscope 220. Computer 230 may send configuration and set up commands such as timing and voltage levels. Computer 230 may use information received from digitizing oscilloscope 220 to calculate the extinction ratio, jitter, power, etc.

Digitizing oscilloscope 220 may be configured to trigger from the optical signal and to capture the data pattern waveform using a non-persistence waveform-averaging mode. Once the waveform is captured, data representative of the waveform stored in digitizing oscilloscope 220 may now be manipulated and used in calculations by computer 230 as described above. As will be described in more detail below, the waveform is captured first using as few as 1 waveform to measure the extinction ratio. Digitizing oscilloscope 220 is then configured to capture and average at least 16 waveforms before displaying the waveform, then the deterministic jitter component of the signal of the transmitter circuit of optical transceiver 200 is measured. It is noted that although computer 230 is used to set up and configure digitizing oscilloscope 220, it is contemplated that digitizing oscilloscope 220 may be set up and configured manually by a human operator and that calculations performed by computer 230 may also be performed by a human operator.

Figure 3:
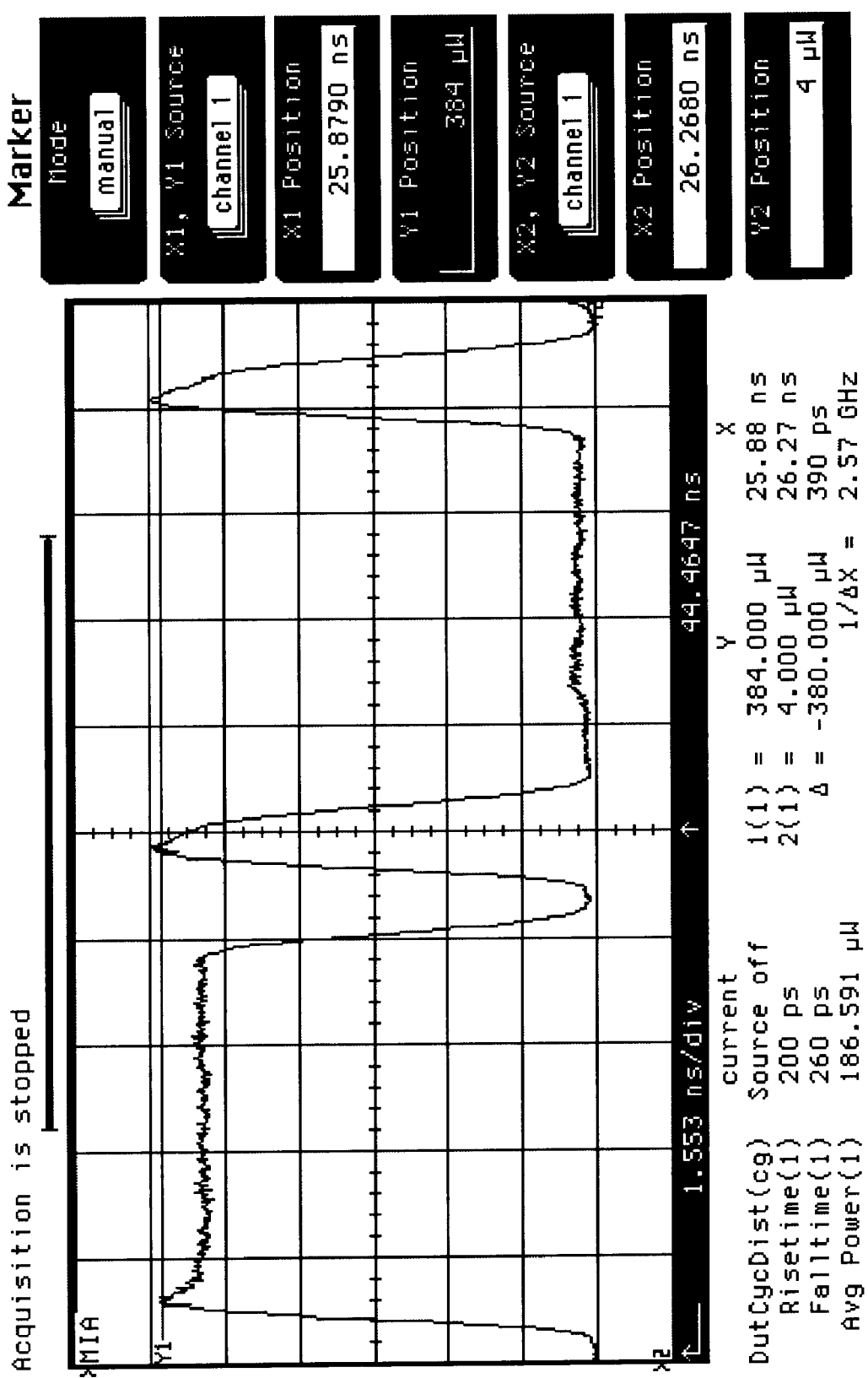
FIG. 3 is a waveform of a data pattern captured on a digitizing oscilloscope during a jitter measurement of an optical transceiver.

Referring to FIG. 3, a waveform of a data pattern captured on a digitizing oscilloscope during a jitter measurement of an optical transceiver is shown. The waveform is labeled with X0–X5. There are also two horizontal cursors: Y1 and Y2. The X0–X5 labels identify rising and falling edges of the waveform. X0 identifies the rising edge of a 6-bit wide pulse, while X1 identifies the falling edge of the same 6-bit wide pulse. X2 identifies the rising edge of a 1-bit pulse, while X3 identifies the falling edge of the same 1-bit pulse. X4 identifies the rising edge of a second 1-bit pulse, while X5 identifies the falling edge of the same 1-bit pulse. The X3 identifier also marks the falling edge of a 6-bit wide binary zero pulse, while X4 identifies the rising edge of that 6-bit wide binary zero. The captured waveform represents the binary pattern 1111110100000010, which is a shifted version of the binary pattern 1010000001011111. Thus the repeating hexadecimal pattern A05F described above has been captured, although shifted a few bits in the scope view.

In FIG. 3, digitizing oscilloscope 220 is DC coupled. Therefore, although the Y2 cursor is positioned at the bottom of the waveform, it is actually not at zero volts. As shown in FIG. 3 the Y2 cursor shows 4.000 uW. The Y1 cursor shows 384 uW.

The Y1 cursor is positioned at the peak of the waveform. This peak may be the result of relaxation oscillation caused by overshoot in the laser and is sometimes referred to as ringing. To compensate for the ringing, a low pass filter such as a Bessel filter may be used to remove some of the ringing in the waveform. The filter may be a selectable option within digitizing oscilloscope 220. To make jitter measurements, the position of the various rising and falling edges are measured with respect to a zero reference. The point at which the position is measured on each respective edge is called the 50% crossing point. Ringing present in the waveform may distort the location of the 50% crossing point, which may in turn produce erroneous jitter measurements. Since the ringing is present in the captured waveform of FIG. 3, an erroneous 50% crossing point might be found without the use of the Bessel filter. In one embodiment, the 50% crossing point may be found by calculating the average power of the waveform. This may be done by placing the Y1 and Y2 cursors as shown. Divide the Y1–Y2 delta by 2, which yields 190 uW. Then add the 4 uW to the 190 uW, resulting in an average power of 194 uW. A cursor may then be positioned such that it reads 194 uW. This is an erroneous 50% crossing point. The average power measured by the oscilloscope is 186 uW. This discrepancy is the result of the ringing peaks. Removing the peaks with the Bessel filter will produce an average power closer to the real average power and therefore a more accurate 50% crossing point may be established.

Figure 4A:
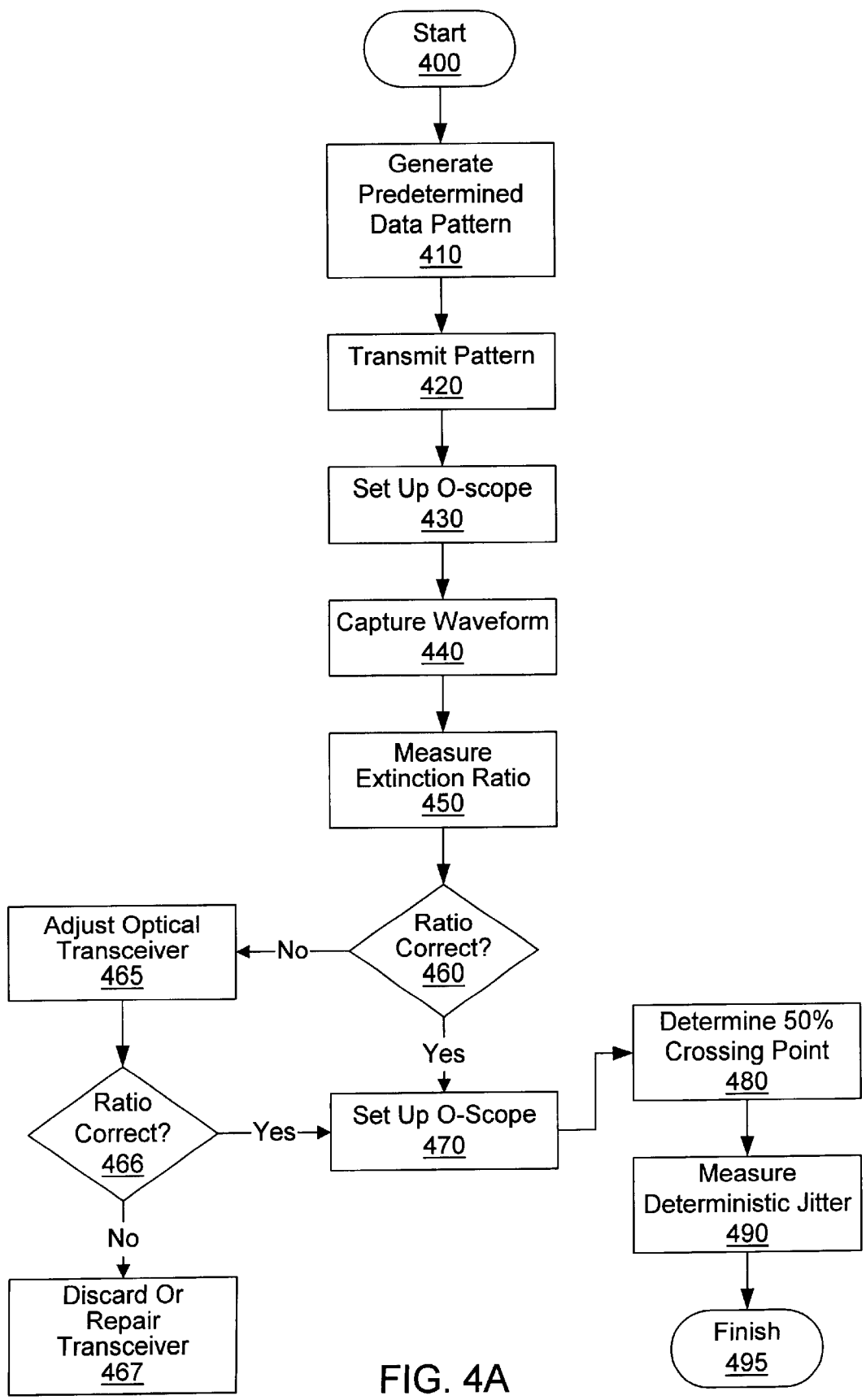
FIG. 4A is a flow diagram of a method for measuring extinction ratio and data dependent jitter.

Turning now to FIG. 4A, a flow diagram of a method for measuring extinction ratio and data dependent jitter is shown. FIG. 4A will be described in conjunction with FIG. 2 and FIG. 3. Starting at step 400 of FIG. 4A, proceed to step 410 where pulse generator 210 of FIG. 2 generates the predetermined pattern of data described above in FIG. 3. Proceed now to step 420 of FIG. 4A where optical transceiver 200 of FIG. 2 transmits the pattern through optical fiber 221 to digitizing oscilloscope 230. Computer 230 is running a program that sends GPIB commands over GPIB cable 236 to digitizing oscilloscope 230, which sets up digitizing oscilloscope 230 to measure specified waveform parameters in a non-persistent averaging mode. To expedite the extinction ratio measurement, it is preferable that digitizing oscilloscope 230 be set to a very low averaging count, such as one.

Proceeding to step 440 of FIG. 4A, the waveform is captured and stored in digitizing oscilloscope 230 of FIG. 2. The Y1 cursor of FIG. 3 is positioned to measure the amplitude of the flat portion of the top of the binary ones in the waveform, while the Y2 cursor is positioned to measure the amplitude of the flat portion of the bottom of the binary zeros in the waveform.

Proceed to step 450 of FIG. 4A. Step 450 is described in greater detail in FIG. 4B below. The extinction ratio is calculated and compared to a specified value. If the extinction ratio is within specified parameters, the flow continues to step 470 of FIG. 4A. In this embodiment, it is preferred that the extinction ratio be between 11 and 14 dB. If the extinction ratio is too low, there may be laser output power but indiscernible or no data pulses. An extinction ratio that is too high may introduce excessive deterministic jitter. If the extinction ratio is not within specified parameters, then operation proceeds to step 465, where optical transceiver 200 of FIG. 2 may be adjusted. The adjustment may adjust the transmitter circuit within optical transceiver 200 until either the ratio is correct as specified in step 466 of FIG. 4A or optical transceiver 200 of FIG. 2 may be discarded or repaired as in step 467 of FIG. 4A. In a preferred embodiment a human operator may view the extinction ratio calculation result as the extinction ratio is adjusted.

If the extinction ratio is correct, operation proceeds to step 470 where digitizing oscilloscope 230 is again set up to measure waveform parameters in a non-persistent averaging mode. In a preferred embodiment, the averaging may be set to average at least 16 waveforms. Proceeding to step 480, the 50% crossing point is determined as described above in FIG. 3. Operation proceeds now to step 490 of FIG. 4A where the deterministic jitter is measured. Step 490 is described in greater detail below. Operation now proceeds to step 495, which completes the measurement process.

Figure 4B:
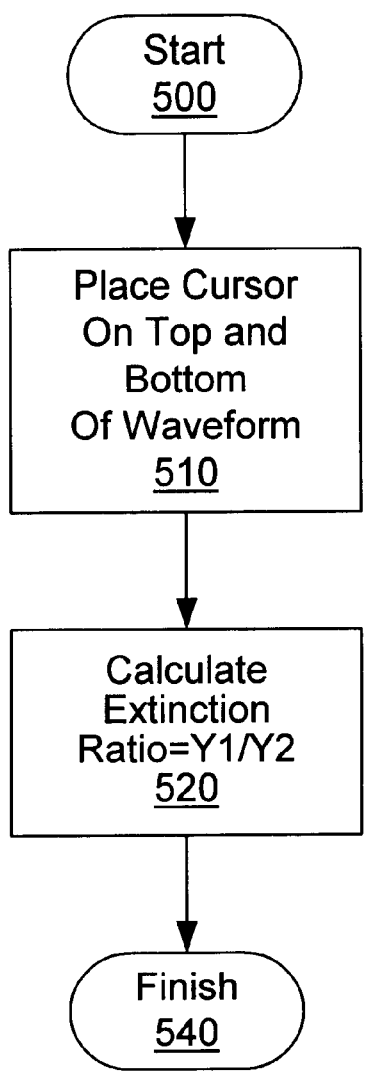
FIG. 4B is a flow diagram of a method for measuring extinction ratio.

Referring to FIG. 4B, a flow diagram of a method for measuring extinction ratio is shown in greater detail. Starting at step 500, proceed to step 510. As described above, The Y1 cursor is positioned on the flat portion of the top of a string of binary ones in the displayed waveform. The Y2 cursor is positioned on the flat portion of the bottom of a string of binary zeros in the displayed waveform. Since the extinction ratio is the ratio (in dB) of the average optical energy of a binary one to the average optical energy of a binary zero, the extinction ratio is calculated by dividing the value measured at Y1 by the value measured at Y2 and converting the result to dB.

Figure 4C:
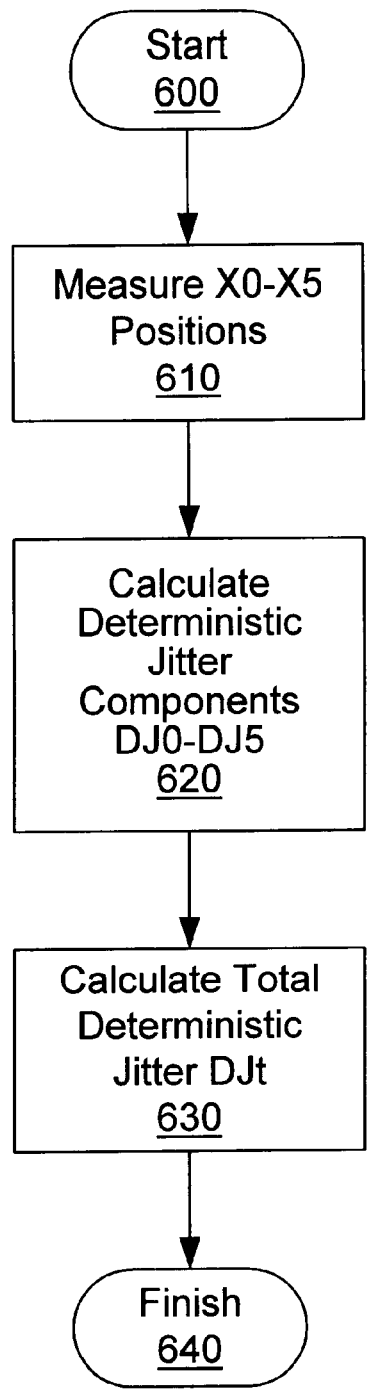
FIG. 4C is a flow diagram of a method for measuring data dependent jitter.

Turning to FIG. 4C, a flow diagram of a method for measuring data dependent jitter is shown in greater detail. Starting at step 600, proceed to step 610. Once the 50% crossing point is determined, then the value at each rising and falling edge can be calculated. As described above in FIG. 3, the identifiers X0–X5 represent each rising and falling edge of the waveform. Proceeding to step 620 of FIG. 4C, the deterministic jitter component at each of identifiers X0–X5 is calculated and may be referred to as DJ0–DJ5, respectively. These are calculated as follows:

$DJ0 = 0(941) - (X0-X0) = 0$ $DJ1 = 6(941) - (X1-X0)$ $DJ2 = 7(941) - (X2-X0)$ $DJ3 = 8(941) - (X3-X0)$ $DJ4 = 14(941) - (X4-X0)$ $DJ5 = 15(941) - (X5-X0)$.

The number 941 represents the pulse width in picoseconds of one bit. The multiplier (0,6,7,8,14 and 15) is the number of bits included from the reference identifier X0. For example, the 6 in DJ1 represents 6 bits of data from X0 to X1. The 6 multiplied by the 941 represents the theoretical position of the edge marked X1. The X1−X0 represents the measured width of the 6 data bits from X0 to X1. The difference between the theoretical and the measured value represents the deterministic jitter component for those 6 bits, called DJ1. This same type measurement is performed for the remaining edges (DJ2–DJ5). Some of the individual components may be positive and some may be negative, depending on whether the pulse is smaller or larger than the theoretical value. Once these individual components have been calculated, operation proceeds to step 630. In step 630, the total deterministic jitter resulting from data dependency is now calculated as follows:

$$DJt = |Max\ Pos(DJ0, DJ1, DJ2, DJ3, DJ4, DJ5)| + |Max\ Neg(DJ0, DJ1, DJ2, DJ3, DJ4, DJ5)|$$

Thus, the total deterministic jitter may be found by:

Finding the positive component with the largest magnitude.

Finding the negative component with the largest magnitude.

Calculating the absolute value of the maximum positive value and the absolute value of the maximum negative value.

The jitter may then be expressed as a single value by adding the two absolute values together. The jitter may also be expressed as the range of values between the maximum positive and maximum negative values. The random jitter component resulting from Gaussian sources is not included since it has been removed by using averaging on digitizing oscilloscope 220 of FIG. 2. The operation may now proceed to step 640 and the measurement is complete.

The accuracy of the measurements made by digitizing oscilloscope 220 may be determined by the number of samples taken from each captured waveform. For example, in a 16.5-bit waveform using a digitizing oscilloscope 220 with 1024, 2048 and 4024 sampling sizes the following resolution may be obtained:

1024 point=16.5(941)/1024=15.16 ps;

2048 point=16.5(9410/2048=8.08 ps;

4024 point=16.5(941)/4024=4.04 ps.

Thus, if the deterministic jitter measurement were expected to be in the tens of picoseconds, the 1024-point sample size would yield an unacceptable resolution of 15.16 ps. Thus, it is preferable that a suitable sampling size be used which will provide a suitable resolution for the expected measurement.

Numerous variations and modifications will become apparent to those skilled in the art once the above disclosure is fully appreciated. It is intended that the following claims be interpreted to embrace all such variations and modifications.

What is claimed is:

1. A measurement system for characterizing an optical transceiver, said system comprising:
   a computing node;
   an oscilloscope coupled to said computing node and to said optical transceiver, wherein said oscilloscope is configured to capture a waveform of a predetermined data pattern transmitted by said optical transceiver, wherein said oscilloscope is configured to capture said waveform of a predetermined data pattern in a non-persistent mode using waveform averaging, wherein said oscilloscope is configured to perform measurements on said waveform of a predetermined data pattern;
   wherein said computing node is configured to program said oscilloscope to perform said measurements on said waveform of a predetermined data pattern, wherein said computing node is configured to calculate an extinction ratio and to compare said extinction ratio to an acceptable standard, wherein said computing node is configured to calculate a deterministic jitter value of said optical transceiver in response to said extinction ratio being within said acceptable standard.

2. The measurement system as recited in claim 1, wherein said extinction ratio is a ratio of an amplitude of a binary one to an amplitude of a binary zero, wherein said amplitude of a binary one is measured on a non-oscillatory portion of a peak of said binary one and said amplitude of a binary zero is measured on a non-oscillatory portion of a peak of said binary zero.

3. The measurement system as recited in claim 1, wherein said oscilloscope is further configured to measure a position of each of a plurality of data pulse edges corresponding to said pattern of data with respect to a zero reference position.

4. The measurement system as recited in claim 3, wherein said oscilloscope is further configured to measure said position of each of said plurality of data pulse edges at a 50% crossing point, wherein said 50% crossing point is an average power point of said waveform of a predetermined data pattern as measured using a filter.

5. The measurement system as recited in claim 4, wherein said deterministic jitter value is calculated by:
   calculating a plurality of positive and negative jitter components corresponding to said plurality of data pulse edges;
   finding a first maximum value of said positive jitter components and a second maximum value of said negative jitter components;
   calculating a first absolute value of said first maximum value of said positive jitter components and a second absolute value of said second maximum value of said negative jitter components;
   adding said first absolute value to said second absolute value.

6. The measurement system as recited in claim 5, wherein said predetermined data pattern is a repeating hexadecimal pattern of A05F.

7. The measurement system as recited in claim 1, wherein said waveform averaging is set to one during said calculation of said extinction ratio.

8. The measurement system as recited in claim 1, wherein said waveform averaging is set to at least 16 during said calculation of said deterministic jitter value.

9. The measurement system as recited in claim 1, wherein said computing node is further configured to communicate with said oscilloscope using a general-purpose interface bus protocol.

10. A method of operating a measurement system for characterizing an optical transceiver including a computing node and an oscilloscope, said method comprising:
    capturing a waveform of a predetermined data pattern transmitted by said optical transceiver in a non-persistent mode using waveform averaging;
    calculating an extinction ratio and comparing said extinction ratio to an acceptable standard; and
    calculating a deterministic jitter value of said optical transceiver in response to said extinction ratio being within said acceptable standard.

11. The method as recited in claim 10, wherein said extinction ratio is a ratio of an amplitude of a binary one to an amplitude of a binary zero, wherein said amplitude of a binary one is measured on a non-oscillatory portion of a peak of said binary one and said amplitude of a binary zero is measured on a non-oscillatory portion of a peak of said binary zero.

12. The method as recited in claim 10 further comprising measuring a position of each of a plurality of data pulse edges corresponding to said pattern of data with respect to a zero reference position.

13. The method as recited in claim 12 further comprising measuring said position of each of said plurality of data pulse edges at a 50% crossing point, wherein said 50% crossing point is an average power point of said waveform of a predetermined data pattern as measured using a filter.

14. The method as recited in claim 13 further comprising:
    calculating a plurality of positive and negative jitter components corresponding to said plurality of data pulse edges;
    finding a first maximum value of said positive jitter components and a second maximum value of said negative jitter components;
    calculating a first absolute value of said first maximum value of said positive jitter components and a second absolute value of said second maximum value of said negative jitter components;
    adding said first absolute value to said second absolute value.

15. The method as recited in claim 14, wherein said predetermined data pattern is a repeating hexadecimal pattern of A05F.

16. The method as recited in claim 10, wherein said waveform averaging is set to one during said calculation of said extinction ratio.

17. The method as recited in claim 10, wherein said waveform averaging is set to at least sixteen during said calculation of said deterministic jitter value.

18. The method as recited in claim 10 further comprising said computing node communicating with said oscilloscope using a general-purpose interface bus protocol.

* * * * *